(12) United States Patent
Cai

(10) Patent No.: US 9,548,331 B2
(45) Date of Patent: Jan. 17, 2017

(54) MANUFACTURING METHOD OF QUANTUM DOT LIGHT EMITTING DIODE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventor: Peizhi Cai, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 350 days.

(21) Appl. No.: 14/347,849

(22) PCT Filed: Aug. 5, 2013

(86) PCT No.: PCT/CN2013/080827
§ 371 (c)(1),
(2) Date: Mar. 27, 2014

(87) PCT Pub. No.: WO2014/190613
PCT Pub. Date: Dec. 4, 2014

(65) Prior Publication Data
US 2016/0218141 A1    Jul. 28, 2016

(30) Foreign Application Priority Data
May 27, 2013   (CN) .......................... 2013 1 0201938

(51) Int. Cl.
*H01L 33/00*   (2010.01)
*H01L 27/00*   (2006.01)
(Continued)

(52) U.S. Cl.
CPC .............. *H01L 27/15* (2013.01); *C09K 11/02* (2013.01); *C09K 11/08* (2013.01); *C09K 11/562* (2013.01);
(Continued)

(58) Field of Classification Search
CPC .... H01L 27/15; H01L 27/322; H01L 27/3244; H01L 33/42; H01L 33/16; H01L 33/28; H01L 33/08; H01L 33/0087; H01L 33/06; H01L 2933/0016; C09K 11/562; B82Y 40/00; B82Y 20/00; Y10S 977/774; Y10S 977/892; Y10S 977/95
See application file for complete search history.

(56) References Cited

U.S. PATENT DOCUMENTS 7,399,993 B2 * 7/2008 Matsuda ............. H01L 27/3211
257/88
7,863,813 B2 * 1/2011 Park ..................... C09K 11/612
313/502
(Continued)

FOREIGN PATENT DOCUMENTS

CN    102280546 A    12/2011
CN    103091895 A     5/2013
(Continued)

OTHER PUBLICATIONS

Fang et al., "ZnS nanostructures: From synthesis to applications", 2011, Progress in Material Science, vol. 56, pp. 175-287 (Jan. 2011).*
(Continued)

*Primary Examiner* — Nikolay Yushin
(74) *Attorney, Agent, or Firm* — Ladas & Parry LLP

(57) ABSTRACT

A quantum dot light emitting diode, including a first electrode and a second electrode, a quantum dot light emitting layer disposed between the two electrodes, including at least
(Continued)

a red quantum dot, a green quantum dot and a blue quantum dot, and a black matrix at least disposed among the red quantum dot, the green quantum dot and the blue quantum dot; one of the first electrode and the second electrode that is located on a light exiting side is at least a transparent electrode. With the quantum dot light emitting diode, a full-color display can be realized, and the aperture ratio of pixels can be effectively enhanced. There are further disclosed a manufacturing method of the quantum dot light emitting diode and a display device.

3 Claims, 5 Drawing Sheets

(51) Int. Cl.
| | | |
|---|---|---|
| H01L 27/15 | (2006.01) | |
| H01L 27/32 | (2006.01) | |
| H01L 33/06 | (2010.01) | |
| C09K 11/02 | (2006.01) | |
| C09K 11/08 | (2006.01) | |
| H05B 33/14 | (2006.01) | |
| C09K 11/56 | (2006.01) | |
| H01L 33/08 | (2010.01) | |
| H01L 33/16 | (2010.01) | |
| H01L 33/28 | (2010.01) | |
| H01L 33/42 | (2010.01) | |
| H01L 33/50 | (2010.01) | |
| B82Y 20/00 | (2011.01) | |
| B82Y 40/00 | (2011.01) | |

(52) U.S. Cl.
CPC ......... *H01L 27/322* (2013.01); *H01L 33/0087* (2013.01); *H01L 33/06* (2013.01); *H01L 33/08* (2013.01); *H01L 33/16* (2013.01); *H01L 33/28* (2013.01); *H01L 33/42* (2013.01); *H05B 33/14* (2013.01); *B82Y 20/00* (2013.01); *B82Y 40/00* (2013.01); *H01L 33/504* (2013.01); *H01L 2933/0016* (2013.01); *Y10S 977/774* (2013.01); *Y10S 977/892* (2013.01); *Y10S 977/95* (2013.01)

(56) References Cited

U.S. PATENT DOCUMENTS

| | | | | |
|---|---|---|---|---|
| 8,013,516 | B2* | 9/2011 | Cok | H01L 51/5234 |
| | | | | 313/503 |
| 8,552,416 | B2* | 10/2013 | Kim | H01L 51/502 |
| | | | | 257/13 |
| 2010/0060553 | A1* | 3/2010 | Zimmerman | H01L 25/0753 |
| | | | | 345/60 |
| 2011/0291071 | A1 | 12/2011 | Kim et al. | |
| 2013/0228926 | A1* | 9/2013 | Maeda | H01L 27/1225 |
| | | | | 257/751 |
| 2014/0204319 | A1 | 7/2014 | Cai et al. | |

FOREIGN PATENT DOCUMENTS

| | | |
|---|---|---|
| CN | 20325077 U | 10/2013 |
| KR | 20080041780 A | 5/2008 |

OTHER PUBLICATIONS

Bhaegava, Doped nanocrystalline materials—Physics and applications, 1996, Journal of Luminescence, vol. 70, pp. 85-94. Dec. 1996.*
International Search Report mailed Feb. 27, 2014; PCT/CN2013/080827.
International Preliminary Report on Patentability Appln. No. PCT/CN2013/080827; Dated Dec. 1, 2015.
First Chinese Office Action Appln. No. 201310201938.5; Dated May 22, 2015.

* cited by examiner

MANUFACTURING METHOD OF QUANTUM DOT LIGHT EMITTING DIODE

TECHNICAL FIELD

Embodiments of the present invention relate to a quantum dot light emitting diode and a manufacturing method thereof, and a display device.

BACKGROUND

A Quantum Dot (QD) is usually a nanometer particle composed by a group II-VI elements or group III-V elements, and can emit fluorescence after excited. The emission spectrum of quantum dots can be controlled by varying the sizes of the quantum dots, and both the fluorescent intensity and stability of the emission are good, and thus quantum dots are a good electroluminescent material.

Quantum dots have many kinds, examples of which are CdS, CdSe, CdTe, ZnO, ZnS, ZnSe, ZnTe and so on in group II-VI, and GaAs, GaP, GaAs, GaSb, HgS, HgSe, HgTe, InAs, InP, InSb, AlAs, AlP, AlSb and so on in group III-V. Manufacturing methods of quantum dots mainly include molecular beam epitaxy, metal organic chemical vapor deposition, self-assembly growth, colloid chemistry, etc. Quantum dots of different sizes can be fabricated on the basis of different chemical conditions.

As compared to a general organic light-emitting diode (OLED) display device, quantum dot light-emitting display (QD-LED) is a display apparatus adopting a quantum dot light emitting layer material. Because quantum dots are inorganic materials and can overcome drawbacks of sensitivity to oxygen and moisture, poor stability, short lifetime, difficulty for package, etc. possessed by organic luminous materials, they have broad prospects for development.

SUMMARY

According to embodiments of the present invention, there are provided a quantum dot light emitting diode and manufacturing method thereof, and a display device, capable of realizing full-color display and enhancing the aperture ratio of pixels effectively.

One aspect of the invention provides a quantum dot light emitting diode, comprising a first electrode and a second electrode, a quantum dot light emitting layer disposed between the two electrodes, comprising at least a red quantum dot, a green quantum dot and a blue quantum dot, and a black matrix at least disposed among the red quantum dot, the green quantum dot and the blue quantum dot; one of the first electrode and the second electrode that is located on a light exiting side is at least a transparent electrode.

For example, quantum dots in the quantum dot light emitting layer include a zinc sulfide nano semiconductor compound; the zinc sulfide nano semiconductor compound contained in the red quantum dot has a grain diameter of 10 to 12 nm, the zinc sulfide nano semiconductor compound contained in the green quantum dot has a grain diameter of 7 to 8 nm, and the zinc sulfide nano semiconductor compound contained in the blue quantum dot has a grain diameter of 4 to 5 nm.

For example, the first electrode or the second electrode is divided by the black matrix into matrix electrodes for driving the quantum dots that emit light, respectively.

Another aspect of the invention provides a display device, comprising any of the above quantum dot light emitting diodes.

For example, the display device further includes a thin film transistor that is disposed between a substrate and a first electrode or a second electrode close to the substrate in the quantum dot light emitting diode; the thin film transistor includes a gate electrode, a gate insulating layer, an active layer and source and drain electrodes, and the drain electrode is connected to one of the first electrode and the second electrode.

For example, the black matrix of the quantum dot light emitting diode is disposed among a stack of the red quantum dot of the quantum dot light emitting layer and the first electrode or the second electrode close to the substrate corresponding to the red quantum dot, a stack of the green quantum dot and the first electrode or the second electrode close to the substrate corresponding to the green quantum dot, and a stack of the blue quantum dot and the first electrode or the second electrode close to the substrate corresponding to the blue quantum dot, and the second electrode or the first electrode far away from the substrate is disposed to cover the substrate.

For example, the active layer includes an amorphous silicon semiconductor layer, a metal oxide semiconductor layer, a low temperature polysilicon layer, or a high temperature polysilicon layer.

For example, where the active layer includes an amorphous silicon semiconductor layer, the active layer further includes an ohmic contact layer; or where that the active layer includes a metal oxide semiconductor layer, the thin film transistor further includes an etching stop layer.

For example, the substrate is an opaque substrate or a transparent substrate.

For example, a substance of the substrate is metal, glass or flexible substance.

Still another aspect of the invention provides a manufacturing method of a quantum dot light emitting diode, comprising: forming a first electrode and a second electrode on a substrate, forming a quantum dot light emitting layer that includes at least a red quantum dot, a green quantum dot and a blue quantum dot between the two electrodes, and forming a black matrix at least among the red quantum dot, the green quantum dot and the blue quantum dot.

For example, forming of the red quantum dot includes: dissolving a zinc sulfide nano semiconductor compound with a particle diameter of 10 to 12 nm into an organic solvent to form a first mixture; coating the first mixture on a substrate and conducting a patterning process treatment so as to form the red quantum dot after the organic solvent has volatilized.

For example, forming of the green quantum dot includes: dissolving a zinc sulfide nano semiconductor compound with a particle diameter of 7 to 8 nm into an organic solvent to form a second mixture; coating the second mixture on a substrate and conducting a patterning process treatment so as to form the green quantum dot after the organic solvent has volatilized.

For example, forming of the blue quantum dot includes: dissolving a zinc sulfide nano semiconductor compound with a particle diameter of 4 to 5 nm into an organic solvent to form a third mixture; coating the third mixture on a substrate and conducting a patterning process treatment so as to form the blue quantum dot after the organic solvent has volatilized.

For example, forming of the black matrix among the red quantum dot, the green quantum dot and the blue quantum dot includes: forming the black matrix among a stack of the red quantum dot and the second electrode corresponding to the red quantum dot, a stack of the green quantum dot and the second electrode corresponding to the green quantum dot, and a stack of the blue quantum dot and the second electrode corresponding to the blue quantum dot, and the first electrode covering the substrate; or, forming the black matrix among a stack of the red quantum dot and the first electrode corresponding to the red quantum dot, a stack of the green quantum dot and the first electrode corresponding to the green quantum dot, and a stack of the blue quantum dot and the first electrode corresponding to the blue quantum dot, and the second electrode covering the substrate.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

REFERENCE NUMERALS

Figure 1:
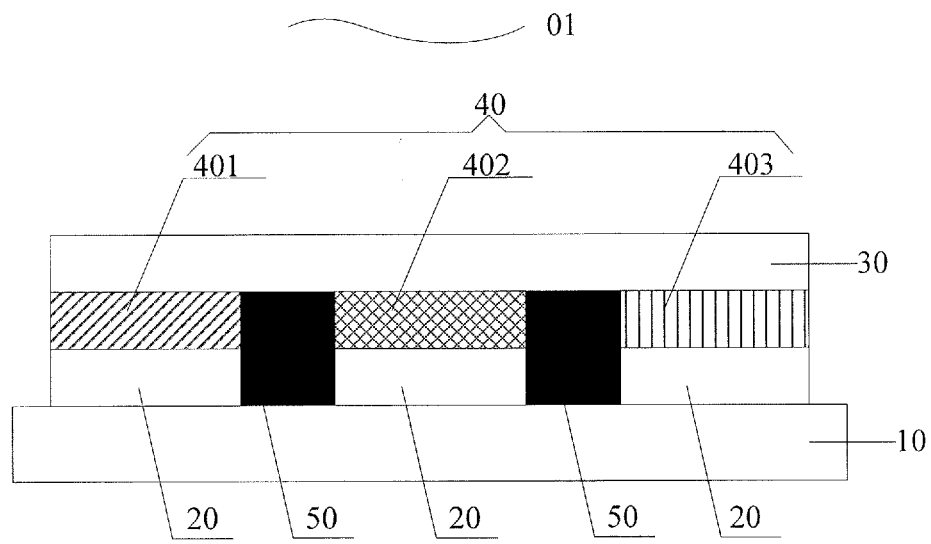
FIG. 1 is structurally schematic view 1 illustrating a quantum dot light emitting diode provided in an embodiment of the invention.

01—a quantum dot light emitting diode; 10—a substrate; 20—a first electrode; 30—a second electrode; 40—a quantum dot light emitting layer, 401—a red quantum dot, 402—a green quantum dot, 403—a blue quantum dot; 50—a black matrix; 60—a thin film transistor, 601—a gate electrode, 602—a gate insulating layer, 603—an active layer, 603a—an amorphous silicon semiconductor layer, 603b—an ohmic contact layer, 603c—a metal oxide semiconductor layer, 604a—a source electrode, 604b—a drain electrode; 605—an etching stop layer; 70—a protective layer.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

An embodiment of the invention provides a quantum dot light emitting diode 01. As shown in FIG. 1 to FIG. 4, the quantum dot light emitting diode 01 includes: a first electrode 20 and a second electrode 30 disposed on a substrate 10, a quantum dot light emitting layer 40 disposed between the two electrodes. The quantum dot light emitting layer 40 comprises at least a red quantum dot 401, a green quantum dot 402 and a blue quantum dot 403, and a black matrix 50 at least disposed among the red quantum dot 401, the green quantum dot 402 and the blue quantum dot 403. Of the first electrode 20 and the second electrode 30, the electrode that is located on a light exiting side is at least a transparent electrode.

It is to be noted that, in addition to the red quantum dot 401, the green quantum dot 402 and the blue quantum dot 403, the quantum dot light emitting layer 40 may further include a white quantum dot or a quantum dot of other color, to which no limit will be imposed here.

When the quantum dot light emitting layer 40 further includes a white quantum dot or a quantum dot of other color, it is also possible that the black matrix 50 is provided among the white quantum dot or the quantum dot of other color and the red quantum dot 401, the green quantum dot 402 or the blue quantum dot 403. The specific configuration can be determined according to actual situations, and no descriptions will be given here.

In the embodiment of the invention, the relative position of the first electrode 20 and the second electrode 30 are not limited. It is possible that the first electrode 20 is underlying, and the second electrode 30 is on the upper level. In this case, the second electrode 30 is at least a transparent electrode. Alternatively, it is possible that the first electrode 20 is on the upper level, and the second electrode 30 is underlying. In this case, the first electrode 20 is at least a transparent electrode.

In the embodiment of the invention, where the quantum dot light emitting diode is applied to a display device, the intensity of light emitted from each of the red quantum dot, green quantum dot or blue quantum dot can be controlled independently, namely, at least one electrode of the first electrode and the second electrode that correspond to each of the red quantum dot, green quantum dot or blue quantum dot is separate. That is, by inputting different voltages into the electrodes, the quantum dots can be excited to emit light of different intensities.

In all embodiments of the invention, the quantum dots are nanometer particles composed by group II-VI or group III-V elements.

An embodiment of the invention provides a quantum dot light emitting diode, comprising: a first electrode and a second electrode, a quantum dot light emitting layer disposed between the two electrodes and comprising at least a red quantum dot, a green quantum dot and a blue quantum dot, and a black matrix at least disposed among the red quantum dot, the green quantum dot and the blue quantum dot; one of the first electrode and the second electrode that is located on a light exiting side is at least a transparent electrode. The intensity of light emitted from a quantum dot after its excitation is controlled by adjusting an input voltage on the first electrode and/or the second electrode, so as to regulate the luminous efficacy of red, green and blue light. Where the quantum dot light emitting diode is applied to a display device, full-color display can be realized. Furthermore, by providing the black matrix among the red, green and blue quantum dots, occurrence of undesirable cross-talk among colors can be effectively prevented; as compared to the case where there is a cell-assembling deviation when existing array substrate and color filter substrate are cell-aligned, the quantum dot light emitting diode can effectively improve the aperture ratio of pixels when it is applied to a display device.

Considering that some elements in group II-VI or group III-V (such as Cd, Hg and so on) are toxic, in the embodiments of the invention, preferably, the zinc sulfide (ZnS) nano semiconductor compound is mainly used as a quantum dot material. In this case, in case of red light emitting, i.e., red quantum dot, the zinc sulfide (ZnS) nano semiconductor compound with a grain diameter of 10 to 12 nm may be selected; in case of green light emitting, i.e., green quantum dot, the zinc sulfide (ZnS) nano semiconductor compound with a grain diameter of 7 to 8 nm may be selected; and in case of blue light emitting, i.e., blue quantum dot, the zinc sulfide (ZnS) nano semiconductor compound with a grain diameter of 4 to 5 nm may be selected In order that the intensities of the light emitted from the quantum dots can be controlled, for example, the first electrode 20 or the second electrode 30 is divided by the black matrix 50 into electrodes arranged in a matrix (matrix electrodes) for driving the quantum dots that emit light, respectively.

Figure 2:
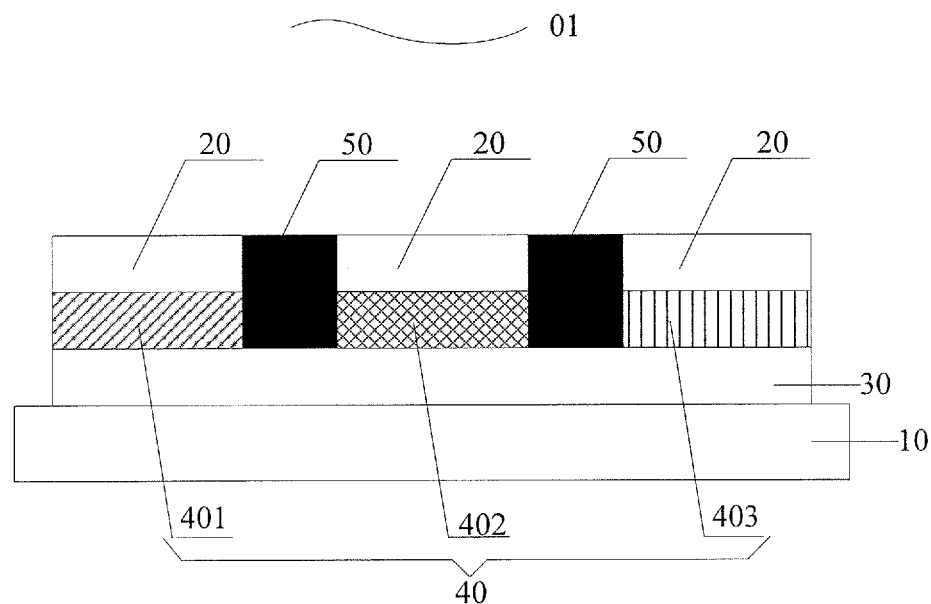
FIG. 2 is structurally schematic view 2 illustrating a quantum dot light emitting diode provided in an embodiment of the invention.

In case that the first electrode 20 is matrix electrodes, as shown in FIG. 1 and FIG. 2, the black matrix 50 is disposed among the stack of the red quantum dot 401 and the first electrode 20 corresponding to the red quantum dot, the stack of the green quantum dot 402 and the first electrode 20 corresponding to the green quantum dot, and the stack of the blue quantum dot 403 and the first electrode 20 corresponding to the blue quantum dot, and the second electrode 30 is disposed to cover the substrate 10.

It should be noted that, in all of embodiments of the invention, the description that the first electrode 20 or the second electrode 30 covers the substrate 10 means that the first electrode 20 or the second electrode 30 are flatly spread out on the substrate 10 in a layer, namely, it is unnecessary to form a pattern by a patterning process during manufacture. In addition, the substrate 10 here may be a substrate on which a pattern layer has been formed.

Figure 3:
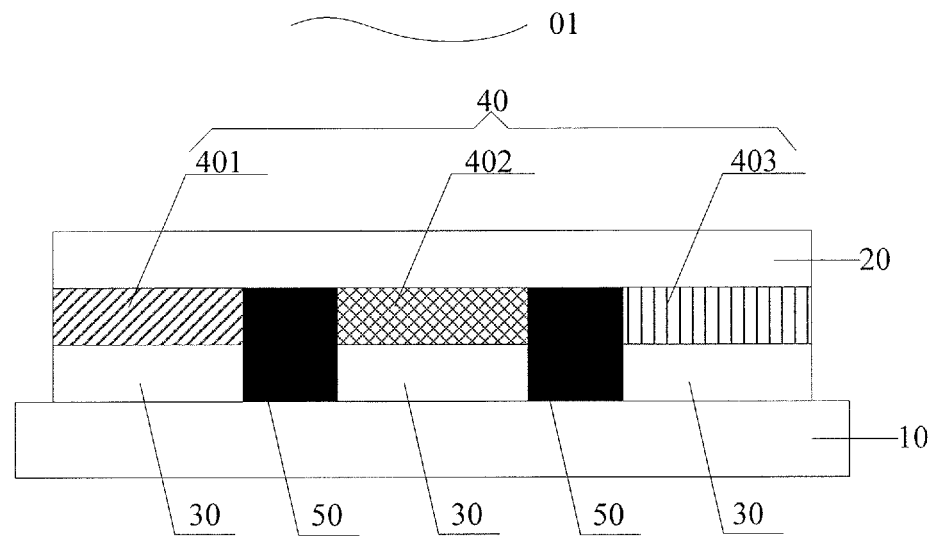
FIG. 3 is structurally schematic view 3 illustrating a quantum dot light emitting diode provided in an embodiment of the invention.
Figure 4:
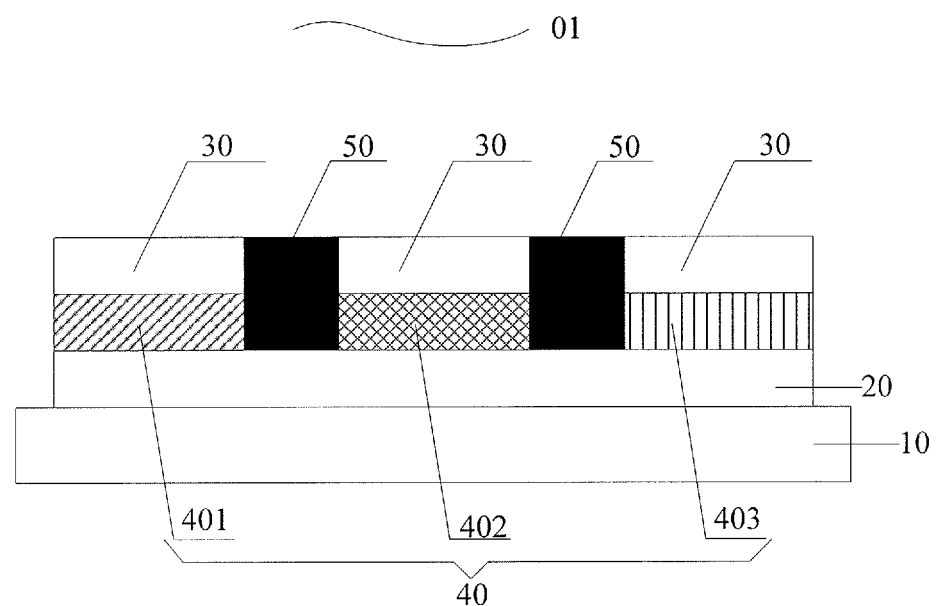
FIG. 4 is structurally schematic view 4 illustrating a quantum dot light emitting diode provided in an embodiment of the invention.

In this way, the second electrode 30 may be disposed as a flatly spread layer, so that the process steps can be reduced and independent control of the intensity of light emitted from the quantum dots after excitation can be realized to thereby regulate the luminous efficacy of red, green and blue light. Thus, the costs can be saved.

Where the second electrode 30 is matrix electrodes, as shown in FIG. 3 and FIG. 4, the black matrix 50 is disposed among the stack of the red quantum dot 401 and the second electrode 30 corresponding to the red quantum dot, the stack of the green quantum dot 402 and the second electrode 20 corresponding to the green quantum dot, and the stack of the blue quantum dot 403 and the second electrode 20 corresponding to the blue quantum dot, and the first electrode 30 is disposed to cover the substrate 10.

In this way, the first electrode 20 may be disposed to be a flatly spread layer, so that the process steps can be reduced, and independent control of the intensity of light emitted from the quantum dots after excitation can be realized to thereby regulate the luminous efficacy of red, green and blue light. Thus, the costs can be saved.

An embodiment the invention further provides a display device, comprising the above quantum dot light emitting diode 01. Here, the quantum dot light emitting diode 01 is applicable to a passive matrix display device, and is also applicable to an active matrix display device, to which no limit will be set here.

An embodiment the invention provides a display device, comprising any of the above quantum dot light emitting diodes 01. The intensity of light emitted from a quantum dot after its excitation is controlled by adjusting an input voltage of the first electrode and/or the second electrode, so as to regulate the luminous efficacy of red, green and blue light. Thus, full-color display is realized. Furthermore, by providing the black matrix among the red, green and blue quantum dots, occurrence of undesirable cross-talk in colors can be effectively prevented, and as compared to the case where there is a cell-assembling deviation when existing array substrate and color filter substrate are cell-aligned, the display device can effectively improve the aperture ratio of pixels.

Where the display device is applied to a passive matrix display device, a row drive line and a column drive line are respectively connected to the first electrode and the second electrode of the quantum dot light emitting diode 01. When a certain row drive line and a certain column drive line are switched on simultaneously, the pixel corresponding to them can be lit up.

Figure 6:
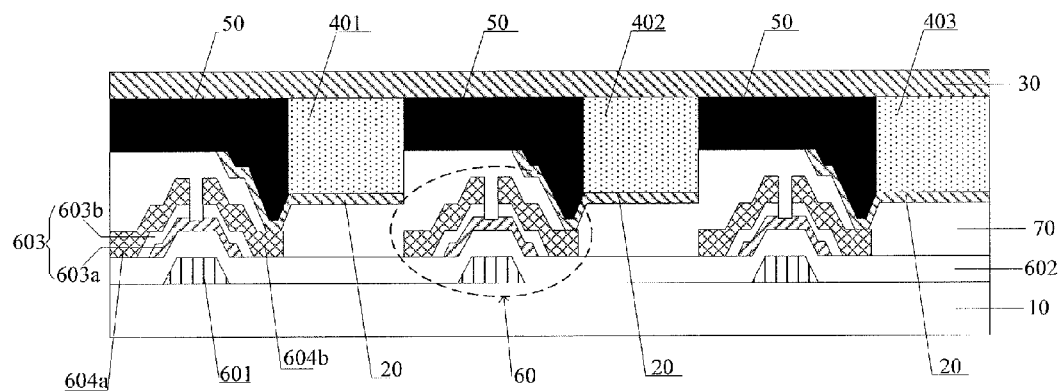
FIG. 6 is structurally schematic view 2 illustrating a display device including a thin film transistor provided in an embodiment of the invention.
Figure 7:
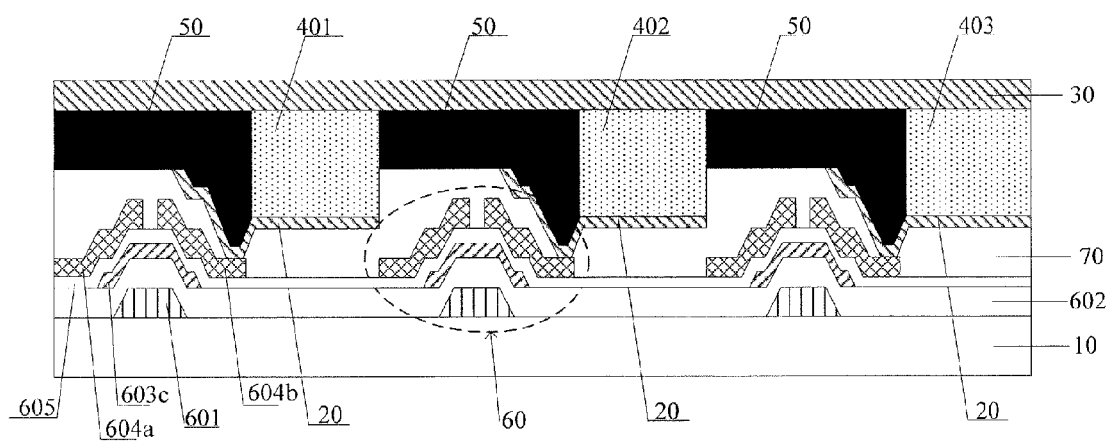
FIG. 7 is structurally schematic view 3 illustrating a display device including a thin film transistor provided in an embodiment of the invention.

It is considered that a passive matrix driving cannot be desirably applied to a large-sized display device, thus preferably the display device provided by the embodiment of the invention may be an active matrix display device. That is, as shown in FIG. 5 to FIG. 7, the display device further includes: a thin film transistor 60 that is disposed between a substrate 10 and one of a first electrode 20 and a second electrode 30, which is close to the substrate, in the quantum dot light emitting diode 01 and functions as a switch device.

The thin film transistor 60 may include a gate electrode 601, a gate insulating layer 602, an active layer 603, and source and drain electrodes 604a and 604b, and the drain electrode 604b is connected to one of the first electrode 20 and the second electrode 30.

It is to be noted that, the configuration of the thin film transistor will not be limited in embodiments of the invention, and it may be of a top-gate type or may be of a bottom-gate type.

Figure 5:
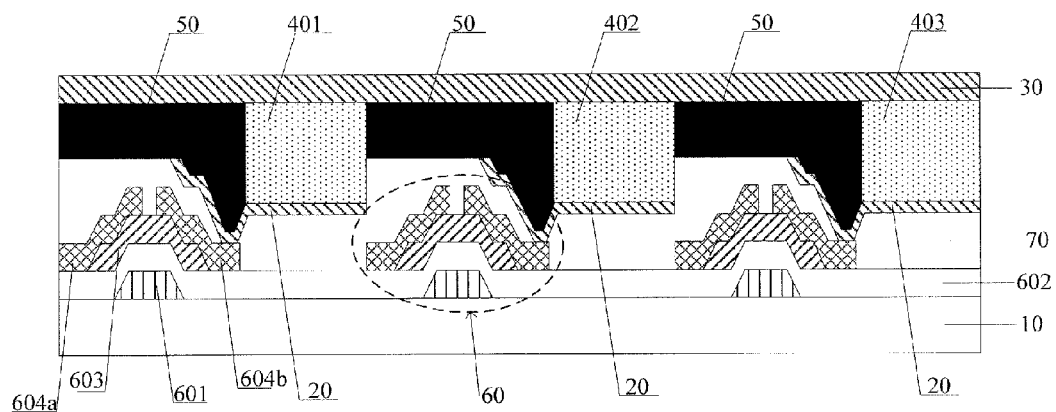
FIG. 5 is structurally schematic view 1 illustrating a display device including a thin film transistor provided in an embodiment of the invention.

As shown in FIG. 5, if the first electrode 20 is close to the substrate 10 and the second electrode 30 is far away from the substrate 10, namely, the first electrode 20 is on the upper level, and the second electrode 30 is underlying, then the thin film transistor 60 is disposed between the first electrode 20 and the substrate 10, and the drain electrode 604b of the thin film transistor 60 is connected to the first electrode 20. The case where the second electrode 30 is underlying and the first electrode 20 is on the upper level is in a similar manner, and details will be omitted here.

Further, preferably, with reference to FIG. 5, when the first electrode 20 is underlying and the second electrode 30 is on the upper level, the drain electrode 604b is connected to the first electrode 20 close to the substrate through a via hole provided in a protective layer 70. The black matrix is disposed among the stack of the red quantum dot 401 of the quantum dot light emitting layer 40 and the first electrode 20 close to the substrate corresponding to the red quantum dot, the stack of the green quantum dot 402 and the first electrode 20 corresponding to the green quantum dot, and the stack of the blue quantum dot 403 and the first electrode 20 corresponding to the blue quantum dot, and the second electrode 30 far away from the substrate is disposed to cover the substrate 10.

In this way, because the drain electrode 604b is connected to the first electrode 20 close to the substrate through a via hole provided in the protective layer 70, the difficulty in the manufacturing process can be simplified. With the position of the black matrix, the process steps can be reduced while independent control of the intensity of light emitted from a quantum dot after its excitation is achieved, and thereby the luminous efficacy of red, green and blue light is regulated. Thus, the costs can be saved.

Regarding the case where the second electrode 30 is underlying and the first electrode 20 is on the upper level, the drain electrode 604b is connected to the second electrode 30 close to the substrate. The black matrix 50 is disposed among the stack of the red quantum dot 401 and the second electrode 30 close to the substrate corresponding to the red quantum dot, the stack of the green quantum dot 402 and the second electrode 30 corresponding to the green quantum dot, and the stack of the blue quantum dot 403 and the second electrode 30 corresponding to the blue quantum dot, and the first electrode 20 far away from the substrate is disposed to cover the substrate 10.

For example, the active layer 603 in the thin film transistor 01 may be an amorphous silicon semiconductor layer, a metal oxide semiconductor layer, a low temperature polysilicon layer, or a high temperature semiconductor layer.

The amorphous silicon semiconductor layer is formed in such a way that, a layer of amorphous silicon thin film is deposited on a substrate and subjected to a patterning process, so as to form the amorphous silicon semiconductor layer in a certain region of the substrate.

The metal oxide semiconductor layer is formed in such a way that, a layer of metal oxide semiconductor thin film is produced on a substrate and subjected to a patterning process, so as to form the metal oxide semiconductor layer in a certain region of the substrate.

The low temperature polysilicon layer is formed in such a way that, a layer of amorphous silicon thin film is deposited on a substrate, and is treated below 600° C. and converted into a polysilicon thin film, and the polysilicon thin film is subjected to a patterning process, so as to form the polysilicon layer in a certain region of the substrate.

The high temperature polysilicon layer, compared to the low temperature polysilicon layer, is formed in such a way that, a layer of amorphous silicon thin film is deposited on a substrate, and is treated above 1000° C. and converted into a polysilicon thin film, and the polysilicon thin film is subjected to a patterning process, so as to form the polysilicon layer in a certain region of the substrate. As the temperature in this process is higher, there is a limit on substance of the substrate, and the applicable substance is generally quartz glass which is resistant to high temperature.

For example, as shown in FIG. 6, where the active layer 603 includes an amorphous silicon semiconductor layer 603a, the active layer 603 further includes an ohmic contact layer 603b. As such, the contact resistance between a metal layer and a semiconductor layer can be decreased, thereby promoting performance of the TFT.

As shown in FIG. 7, where the active layer 603 includes a metal oxide semiconductor layer 603c, the thin film transistor 60 further includes an etching stop layer 605.

As such, influence on the oxide semiconductor active layer can be avoided where a metal layer on the oxide semiconductor active layer is etched in a subsequent process, and the oxide semiconductor active layer can also be avoided from being exposed outside to react with oxygen gas or water in the air to thereby cause degrade in characteristics of the thin film transistor.

In the display device provided by embodiments of the invention, light emitting is performed by exciting a quantum dot to emit light by controlling input voltages of the first electrode 20 and the second electrode 30 and intensity of emission, and thus, it is required that only the electrode on a light exiting side be transparent. Therefore, the substrate in all of embodiments of the invention may be transparent, or may be opaque.

The substance of the substrate may be metal, glass, flexible substance or the like.

A specific embodiment will be given below, so as to describe in detail one of the above display devices. With reference to that shown in FIG. 7, the display device includes: a substrate 10, a gate electrode 601, a gate insulating layer 602, a metal oxide semiconductor layer 603c, an etching stop layer 605, and a source electrode 604a and a drain electrode 604b that are disposed on the substrate in this order, a protective layer 70 disposed on the source electrode and the drain electrode, a first electrode 20 disposed on the protective layer, which is connected to the drain electrode 604b through a via hole provided in the protective layer, and a second electrode 30 disposed above the first electrode; a quantum dot light emitting layer that includes a red quantum dot 401, a green quantum dot 402 and a blue quantum dot 403 is further disposed between the first electrode and the second electrode, and a black matrix 50 is disposed among the stack of the red quantum dot 401 and the first electrode 20 directly below the red quantum dot, the stack of the green quantum dot 402 and the first electrode 20 directly below the green quantum dot, and the stack of the blue quantum dot 403 and the first electrode 20 directly below the blue quantum dot.

The substrate 10 is a transparent substrate or an opaque substrate; the second electrode 30 is flatly spread out on the substrate 10 in a layer; the protective layer 70 includes a via hole exposing the drain electrode 604b; and the gate electrode 601, the gate insulating layer 602, the metal oxide semiconductor layer 603c, the etching stop layer 605, the source electrode 604a and the drain electrode 604b constitute a thin film transistor 01.

In addition, the display device further includes a gate line (not shown in the figure) connected to the gate electrode 601 of the thin film transistor, a data line (not shown in the figure) connected to the source electrode 604a, and so on.

An embodiment the invention provides a display device, in which, the intensities of light emitted from the quantum dots after excitation can be controlled by adjusting an input voltage of the first electrode, so that the luminous efficacy of red, green and blue light can regulated, and therefore full-color display is realized. Furthermore, by providing the black matrix among the red, green and blue quantum dots, occurrence of undesirable cross-talk in colors can be effectively prevented. As compared to the case where a cell-assembling deviation occurs when an array substrate and a color filter substrate are assembled together to form a cell in traditional technology, the display device can effectively improve the aperture ratio of pixels by producing the black matrix and the thin film transistor on a same substrate.

An embodiment of the invention further provides a manufacturing method of a quantum dot light emitting diode, comprising: forming a first electrode 20 and a second electrode 30 on a substrate 10, forming a quantum dot light emitting layer 40 that includes at least a red quantum dot 401, a green quantum dot 402 and a blue quantum dot 403 between the two electrodes, and forming a black matrix 50 at least between the red quantum dot, the green quantum dot and the blue quantum dot.

In this way, the luminous efficacy of red, green and blue light can be regulated by controlling the intensities of light emitted from the quantum dots after excitation, so that full-color display can be realized. Furthermore, by providing the black matrix among the red, green and blue quantum dots, occurrence of undesirable cross-talk in colors can be effectively prevented.

It is considered that some elements in group II-VI or group III-V (such as Cd, Hg and so on) are toxic, and in embodiments of the invention, for example, a zinc sulfide (ZnS) nano semiconductor compound is mainly used as a quantum dot material.

In this case, forming of the red quantum dot 401 includes: a zinc sulfide nano semiconductor compound with a particle diameter of 10 to 12 nm is dissolved into an organic solvent to form a first mixture; and the first mixture is coated on a substrate and subjected to a patterning process, and the red quantum dot 401 is formed in a certain region of the substrate after the organic solvent has volatilized.

The organic solvent may be such as acetone, isopropanol, ethanol or other common organic solvent, and it is preferably acetone here.

The forming of the green quantum dot 402 includes: a zinc sulfide nano semiconductor compound with a particle diameter of 7 to 8 nm is dissolved into an organic solvent to form a second mixture; and the second mixture is coated on a substrate and subjected to a patterning process, and the green quantum dot 402 is formed in a certain region of the substrate after the organic solvent has volatilized.

The forming of the blue quantum dot 403 includes: a zinc sulfide nano semiconductor compound with a particle diameter of 4 to 5 nm is dissolved into an organic solvent to form a third mixture; and the third mixture is coated on a substrate and subjected to a patterning process, and the blue quantum dot 403 is formed in a certain region of the substrate after the organic solvent has volatilized.

It is to be noted that, in embodiments of the invention, no limit will be imposed on the order in which the red quantum dot 401, the green quantum dot 402 and the blue quantum dot 403 are formed.

Further, the forming of the black matrix 50 among the red quantum dot 401, the green quantum dot 402 and the blue quantum dot 403 may include the following two situations.

In a first situation, the black matrix 50 is formed among the stack of the red quantum dot 401 and the second electrode 30 corresponding to the red quantum dot, the stack of the green quantum dot 402 and the second electrode 30 corresponding to the green quantum dot, and the stack of the blue quantum dot 403 and the second electrode 30 corresponding to the blue quantum dot, and the first electrode 20 covers the substrate 10.

As such, the first electrode 20 may be disposed to be a flatly spread layer, so that the process steps can be reduced along with realization of independent control on the intensities of the light emitted from the quantum dots after excitation to thereby regulate the luminous efficacy of red, green and blue light. Thus, the costs can be saved.

In a second situation, the black matrix 50 is formed among the stack of the red quantum dot 401 and the first electrode 20 corresponding to the red quantum dot, the stack of the green quantum dot 402 and the first electrode 20 corresponding to the green quantum dot, and the stack of the blue quantum dot 403 and the first electrode 20 corresponding to the blue quantum dot, and the second electrode 30 covers the substrate 10.

As such, the second electrode 30 may be disposed to be a flatly spread layer, so that the process steps can be reduced along with realization of independent control on the intensities of the light emitted from the quantum dots after excitation to thereby regulate the luminous efficacy of red, green and blue light. Thus, the costs can be saved.

A manufacturing method of one of the above quantum dot light emitting diode will be described in detail below with reference to a specific example. The method includes the following steps.

Figure 8:
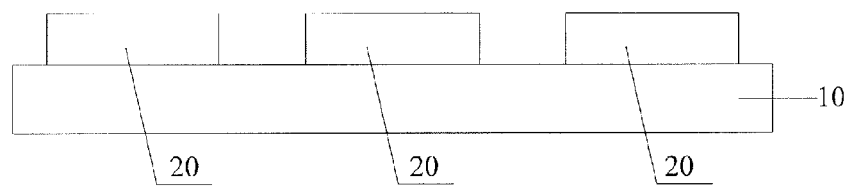
FIG. 8 to FIG. 12 are schematic views illustrating a manufacturing process of a quantum dot light emitting diode provided in an embodiment of the invention.

Step S10, a conductive thin film is produced on a substrate and subjected to one patterning process, so that a matrix of the first electrode 20 shown in FIG. 8 is formed in a certain region of the substrate.

Here, when the quantum dot light emitting diode is applied to a display device, the certain region as stated above is a pixel region.

For example, a layer of conductive thin film may be firstly formed on a substrate by means of magnetron sputtering, chemical vapor deposition or the like. The conductive thin film may adopt calcium, magnesium, aluminum, silver, barium or the like metal, or an alloy including any of the above metals, or adopt ITO (Indium Tin Oxide), IZO (Indium Zinc Oxide), or the like transparent conductive material. Next, the film is subjected to a patterning process including exposure, development, etching, stripping and so on with a mask plate, so as to form the first electrodes 20 in a certain region of the substrate.

Figure 9:
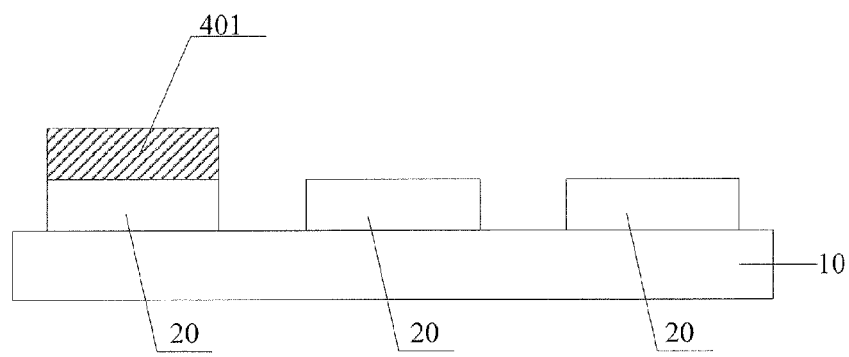

Step S11, on the basis of the substrate subjected to the step S10, a first mixture formed by dissolving a zinc sulfide nano semiconductor compound with a particle diameter of 10 to 12 nm into an organic solvent is coated on the substrate, and subjected to one patterning process, and the red quantum dot 401 shown in FIG. 9 is formed after the organic solvent has volatilized.

For example, it is possible that a zinc sulfide nano semiconductor compound with a particle diameter of 10 to 12 nm is firstly dissolved into an organic solvent to form a first mixture, and then a layer of thin film of the first mixture is coated on a substrate, and the organic solvent may be acetone. Afterwards, it is subjected to a patterning process including exposure, development, etching, stripping and so on with a mask, and the red quantum dot 401 is formed in a certain region of the substrate after the organic solvent has volatilized.

Figure 10:
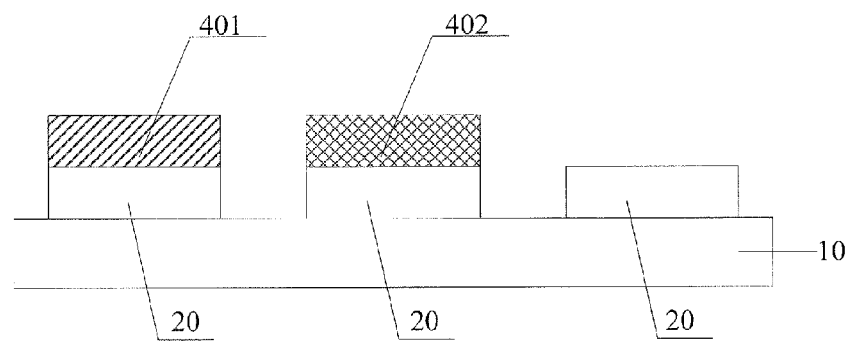

Step S12, on the basis of the substrate subjected to the step S1, a second mixture formed by dissolving a zinc sulfide nano semiconductor compound with a particle diameter of 7 to 8 nm into an organic solvent is coated on the substrate, and subjected to one patterning process, and the green quantum dot 402 shown in FIG. 10 is formed after the organic solvent has volatilized.

Figure 11:
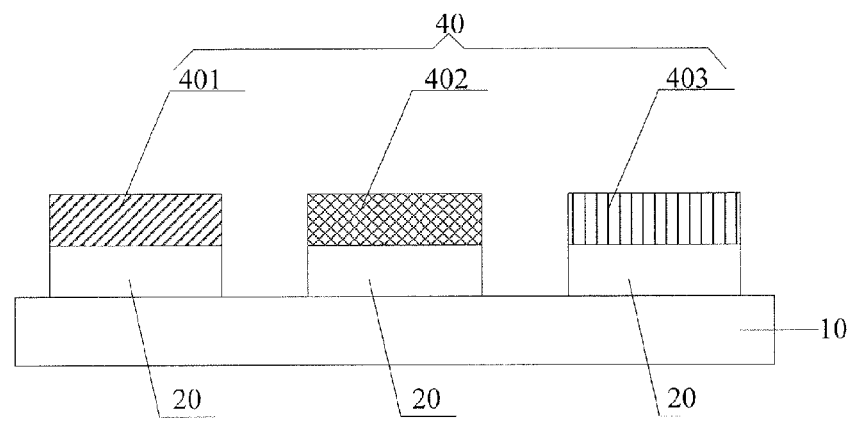

Step S13, for the substrate subjected to the step S12, a third mixture formed by dissolving a zinc sulfide nano semiconductor compound with a particle diameter of 4 to 5 nm in an organic solvent is coated on the substrate, and subjected to one patterning process, and the blue quantum dot 403 shown in FIG. 11 is formed after the organic solvent has volatilized.

After the above steps S11 to S13, the red quantum dot 401, the green quantum dot 402 and the blue quantum dot 403 constitute a quantum dot light emitting layer 40.

Figure 12:
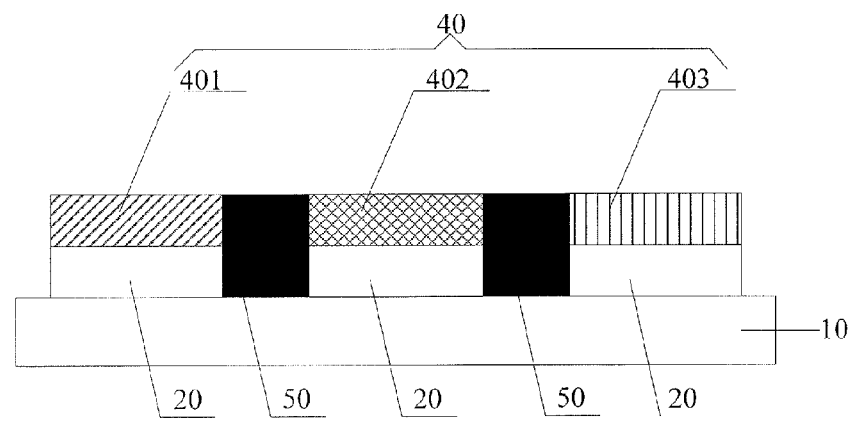

Step S14, on the substrate subjected to the step S13, a black resin thin film is formed and subjected to one patterning process, so as to form a black matrix 50 shown in FIG. 12 among the stack of the red quantum dot 401 and the first electrode 20 corresponding to the red quantum dot, the stack of the green quantum dot 402 and the first electrode 20 corresponding to the green quantum dot, and the stack of the blue quantum dot 403 and the first electrode 20 corresponding to the blue quantum dot.

Step S15, on the substrate subjected to the step S14, a transparent, conductive thin film is produced, and the second electrode referring to that shown in FIG. 1 is formed.

For example, a layer of transparent conductive thin film may be produced on a substrate by using a chemical vapor deposition method. ITO, IZO or the like transparent conductive material is used for the conductive thin film.

An embodiment of the invention provides a fabricating method of a quantum dot light emitting diode, with which, the intensities of the light emitted from quantum dots after excitation can be controlled by adjusting an input voltage of the first electrode 20, so that the luminous efficacy of red, green and blue light can be regulated, and where the quantum dot light emitting diode is applied to a display device, full-color display can be realized. Furthermore, by providing the black matrix among the red, green and blue quantum dots, occurrence of undesirable cross-talk in colors can be effectively prevented. As compared to the case where a cell-assembling deviation occurs when an array substrate and a color filter substrate are assembled together to form a cell in the traditional technology, the aperture ratio of pixels can be effectively enhanced where the quantum dot light emitting diode is applied to a display device.

Descriptions made above are merely exemplary embodiments of the invention, but are not used to limit the protection scope of the invention. The protection scope of the invention is determined by attached claims.

The invention claimed is:

1. A manufacturing method of a quantum dot light emitting diode, comprising: forming a first electrode and a second electrode on a substrate, forming a quantum dot light emitting layer that includes at least a red quantum dot, a green quantum dot and a blue quantum dot between the first electrode and the second electrode, and forming a black matrix at least among the red quantum dot, the green quantum dot and the blue quantum dot, wherein forming of the red quantum dot includes;

dissolving a zinc sulfide nano semiconductor compound with a particle diameter of 10 to 12 nm into a first organic solvent to form a first mixture; and coating the first mixture on the substrate and conducting a first patterning process treatment so as to form the red quantum dot after the organic solvent has volatized;

wherein forming of the green quantum dot includes:

dissolving a zinc sulfide nano semiconductor compound with a particle diameter of 7 to 8 nm into a second organic solvent to form a second mixture; and coating the second mixture on the substrate and conducting a second patterning process treatment so as to form the green quantum dot after the organic solvent has volatized; and wherein forming of the blue quantum dot includes:

dissolving a zinc sulfide nano semiconductor compound with a particle diameter of 4 to 5 nm into a third organic solvent to form a third mixture; and coating the third mixture on the substrate and conducting a third patterning process treatment so as to form the blue quantum dot after the organic solvent has volatilized.

2. The manufacturing method claimed as claim 1, wherein forming of the black matrix among the red quantum dot, the green quantum dot and the blue quantum dot includes:

forming the black matrix among a stack of the red quantum dot and the second electrode corresponding to the red quantum dot, a stack of the green quantum dot and the second electrode corresponding to the green quantum dot, and a stack of the blue quantum dot and the second electrode corresponding to the blue quantum dot, and the first electrode covering the substrate; or, forming the black matrix among a stack of the red quantum dot and the first electrode corresponding to the red quantum dot, a stack of the green quantum dot and the first electrode corresponding to the green quantum dot, and a stack of the blue quantum dot and the first electrode corresponding to the blue quantum dot, and the second electrode covering the substrate.

3. The manufacturing method claimed as claim 1, wherein forming of the black matrix among the red quantum dot, the green quantum dot and the blue quantum dot includes:

forming the black matrix among a stack of the red quantum dot and the second electrode corresponding to the red quantum dot, a stack of the green quantum dot and the second electrode corresponding to the green quantum dot, and a stack of the blue quantum dot and the second electrode corresponding to the blue quantum dot, and the first electrode covering the substrate; or, forming the black matrix among a stack of the red quantum dot and the first electrode corresponding to the red quantum dot, a stack of the green quantum dot and the first electrode corresponding to the green quantum dot, and a stack of the blue quantum dot and the first electrode corresponding to the blue quantum dot, and the second electrode covering the substrate.

* * * * *